(12) United States Patent
Dongare et al.

(10) Patent No.: US 10,833,725 B2
(45) Date of Patent: Nov. 10, 2020

(54) METHODS, SYSTEMS, AND ARTICLES OF MANUFACTURE FOR JOINT DECODING OF PACKETS IN WIRELESS NETWORKS USING CHIRP SPREAD-SPECTRUM MODULATION

(71) Applicant: Carnegie Mellon University, Pittsburgh, PA (US)

(72) Inventors: Adwait Dongare, Pittsburgh, PA (US); Artur Balanuta, Pittsburgh, PA (US); Akshay Gadre, Pittsburgh, PA (US); Robert Iannucci, Palo Alto, CA (US); Swarun Kumar, Pittsburgh, PA (US); Anh Luong, Pittsburgh, PA (US); Revathy Narayanan, Chennai (IN); Anthony Rowe, Pittsburgh, NC (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 16/890,102

(22) Filed: Jun. 2, 2020

(65) Prior Publication Data
US 2020/0304169 A1    Sep. 24, 2020

Related U.S. Application Data

(63) Continuation of application No. 16/374,981, filed on Apr. 4, 2019, now Pat. No. 10,735,047.
(Continued)

(51) Int. Cl.
*H04B 1/71* (2011.01)
*H03D 3/00* (2006.01)
(Continued)

(52) U.S. Cl.
CPC ........... *H04B 1/7102* (2013.01); *H03D 3/009* (2013.01); *H04B 1/12* (2013.01); *H04L 27/364* (2013.01);
(Continued)

(58) Field of Classification Search
CPC ... H04B 1/7102; H04B 1/12; H04B 2001/6912; H03D 3/009; H04L 27/364; H04L 27/3818
See application file for complete search history.

(56) References Cited

U.S. PATENT DOCUMENTS

| | | | |
|---|---|---|---|
| 10,425,362 B2 * | 9/2019 | Champion | ............ H04L 1/0045 |
| 2002/0009125 A1 * | 1/2002 | Shi | ............................ H04B 1/69 375/139 |

(Continued)

*Primary Examiner* — Freshteh N Aghdam
(74) *Attorney, Agent, or Firm* — Stanek Lemon Crouse & Meeks, P.A.

(57) ABSTRACT

A method of providing wireless communications in a wireless network can include wirelessly receiving a chirp spread-spectrum modulated signal at a first gateway device, the chirp spread-spectrum modulated signal being transmitted by a remote client device. The chirp spread-spectrum modulated signal can be demodulated at the first gateway device to provide demodulated data at the first gateway device. The demodulated data can be processed to provide an indication that a decode of a packet including the demodulated data failed. Time adjacent chirps included in the demodulated data can be combined to provide combined data at the first gateway device. A message can be transmitted from the first gateway device to a remote server responsive to an amplitude of the combined data exceeding a threshold value and the indication that the decode of the packet including the demodulated data failed.

10 Claims, 5 Drawing Sheets

Related U.S. Application Data

(60) Provisional application No. 62/761,784, filed on Apr. 5, 2018.

(51) Int. Cl.
    *H04L 27/38*     (2006.01)
    *H04B 1/12*     (2006.01)
    *H04L 27/36*     (2006.01)
    *H04B 1/69*     (2011.01)

(52) U.S. Cl.
    CPC .. *H04L 27/3818* (2013.01); *H04B 2001/6912* (2013.01)

(56) References Cited

U.S. PATENT DOCUMENTS

| | | | |
|---|---|---|---|
| 2004/0052242 A1* | 3/2004 | Laturell | H04L 12/5692 370/352 |
| 2015/0270866 A1* | 9/2015 | Schaffner | H04B 1/69 375/139 |
| 2016/0094269 A1* | 3/2016 | Seller | H04B 1/69 375/139 |
| 2020/0052734 A1* | 2/2020 | Talla | H04L 5/1461 |

* cited by examiner

METHODS, SYSTEMS, AND ARTICLES OF MANUFACTURE FOR JOINT DECODING OF PACKETS IN WIRELESS NETWORKS USING CHIRP SPREAD-SPECTRUM MODULATION

CLAIM FOR PRIORITY

The present Application is a continuation of U.S. patent application Ser. No. 16/374,981, entitled Methods, Systems, and Articles of Manufacture for Joint Decoding of Packets in Wireless Networks Using Chirp Spread-Spectrum Modulation, filed in the U.S.P.T.O on Apr. 4, 2019, that claims priority to U.S. Provisional Application Ser. No. 62/761,784, entitled Exploiting Geographical Diversity Through Coherent Combining In Low-Power Wide-Area Networks filed in the U.S.P.T.O on Apr. 5, 2018, the entire disclosures of which are hereby incorporated herein by reference in their entireties.

STATEMENT OF GOVERNMENT SUPPORT

This invention was made with government funds under Grant No. CNS1329644 from the National Science Foundation and under Grant No. HR0011-18-3-0004 from the Department of Defense Advanced Research Projects Agency. The government has certain rights in the invention.

FIELD

The present invention relates to the field of electronics in general, and more particularly, to wireless communications.

BACKGROUND

Low Power Wide Area Networks (LPWANs) are increasingly seen as an attractive communication platform for city-scale Internet-of-Things (IoT) deployments. They can offer the ability to wirelessly connect energy-constrained devices to gateways over distances of many kilometers. LPWANs also have power and cost advantages over alternatives like cellular networks, particularly in deploy-once, low maintenance and low throughput sensing applications. While LPWANs are far from pervasive, the capabilities of networks like LoRaWAN, SigFox and Ingenu's RPMA have attracted investment and have spawned early deployments. These technologies operate on the unlicensed ISM spectrum, allowing businesses and consumers alike to deploy their own devices and gateways. Given that each LPWAN gateway promises a range of up to ten kilometers, major cities are likely to see a fast-paced expansion in LPWAN coverage.

Devices located in urban spaces deep inside buildings or in remote neighborhoods may experience severe drain in battery as their signals are highly attenuated even at the closest base station. Some of these devices, such as those in basements or tunnels, may not be in communication range of any gateway at all. Given that LPWANs are largely user-deployed and unplanned, many of these devices may remain battery deprived or simply out of network reach in perpetuity, even as thousands of gateways proliferate city-wide.

Private enterprises such as Semtech have developed LPWAN chipsets that use extremely narrow bands of unlicensed spectrum. In contrast, cellular standardization bodies have developed two standards for LPWAN communication for cellular base stations to communicate with low-power IoT devices over licensed spectrum: LTE-M and NB-IOT. Unlike LoRaWAN, these technologies may require devices to periodically wake up to synchronize with the network which may also reduce battery life.

Several recent measurement studies have been conducted to evaluate the performance and range of LPWAN networks and perform theoretical capacity analysis. Early pilot deployment efforts are also underway with SigFox deploying their hardware to connect security alarms to the cloud in Spain, smart blood refrigerators in the Democratic Republic of the Congo and smart city applications.

Multiple-antennas (MIMO) are known to improve SNR and reduce interference. In the WiFi context, past systems have used multi-user MIMO to improve performance on the uplink. In the cellular context, massive MIMO proposals have demonstrated scaling gains of towers with a large number of antennas. There has been much theoretical work on distributed MIMO overall in both the sensor networking context and wireless LANs and cellular networks. Practical distributed MIMO systems, primarily in the LAN-context, have demonstrated both multiplexing and diversity gains.

Multiple research efforts from the industry and academia have advocated the use of PHY layer processing at the cloud as opposed to the base stations. In the cellular context, CloudRAN aims to perform baseband processing at the cloud, allowing base stations to be simple and easy to deploy. One of the challenges however is the need for a reliable fiber optic backhaul to the cloud to collate data streams in a low latency manner, motivating the need for cost-effective high-performance backhauls.

SUMMARY

Embodiments according to the present invention can provide methods, circuits, systems, and articles of manufacture for joint decoding of packets in wireless networks using chirp spread-spectrum modulation. Pursuant to these embodiments, a method of providing wireless communications in a wireless network can include wirelessly receiving a chirp spread-spectrum modulated signal at a first gateway device, the chirp spread-spectrum modulated signal being transmitted by a remote client device. The chirp spread-spectrum modulated signal can be demodulated at the first gateway device to provide demodulated data at the first gateway device. The demodulated data can be processed to provide an indication that a decode of a packet including the demodulated data failed. Time adjacent chirps included in the demodulated data can be combined to provide combined data at the first gateway device. A message can be transmitted from the first gateway device to a remote server responsive to an amplitude of the combined data exceeding a threshold value and the indication that the decode of the packet including the demodulated data failed.

In some embodiments according to the invention, a method of providing wireless communications can include wirelessly receiving a chirp spread-spectrum modulated signal at a first gateway device, where the chirp spread-spectrum modulated signal can be transmitted by a remote client device. The chirp spread-spectrum modulated signal can be demodulated at the first gateway device to provide demodulated data at the first gateway device. The demodulated data can be processed to provide an indication that a decode of a packet including the demodulated data failed. Time adjacent chirps included in the demodulated data from a time interval that is greater than a chirp spread-spectrum preamble time interval can be combined to provide combined data at the first gateway device.

In some embodiments according to the invention, a method of providing wireless communications can include wirelessly receiving a chirp spread-spectrum modulated signal at a first gateway device, where the chirp spread-spectrum modulated signal being can be transmitted by a remote client device. The chirp spread-spectrum modulated signal can be demodulated at the first gateway device to provide demodulated data at the first gateway device. The demodulated data can be processed to provide an indication that a decode of a packet including the demodulated data failed. Time adjacent chirps included in the demodulated data from a time interval that includes a chirp spread-spectrum preamble time interval and at least a portion of a chirp spread-spectrum data time interval can be combined to provide combined data at the first gateway device.

In some embodiments according to the invention, a method of providing communications in a wireless chirp spread-spectrum network can include receiving, at a remote server, first and second messages from first and second gateway devices, respectively, indicating that the first and second gateway devices detected first and second potential packets respectively that failed to decode at the first and second gateway devices respectively. A determination can be made as to whether the first and second potential packets are the same packet based on a similarity between first and second times at which the first and second potential packets were received at the first and second gateway devices and a geographic proximity of the first and second gateway devices to one another to provide a match signal. Third and fourth messages can be transmitted to the first and second gateway devices respectively, responsive to the match signal, the third and fourth messages including requests for I/Q samples of demodulated data stored in first and second buffer circuits in the first and second gateway devices corresponding to the first and second potential packets respectively identified by the first and second times and first and second channel frequencies on which the first and second potential packets were received.

DETAILED DESCRIPTION OF EMBODIMENTS ACCORDING TO THE INVENTION

Figure 1:
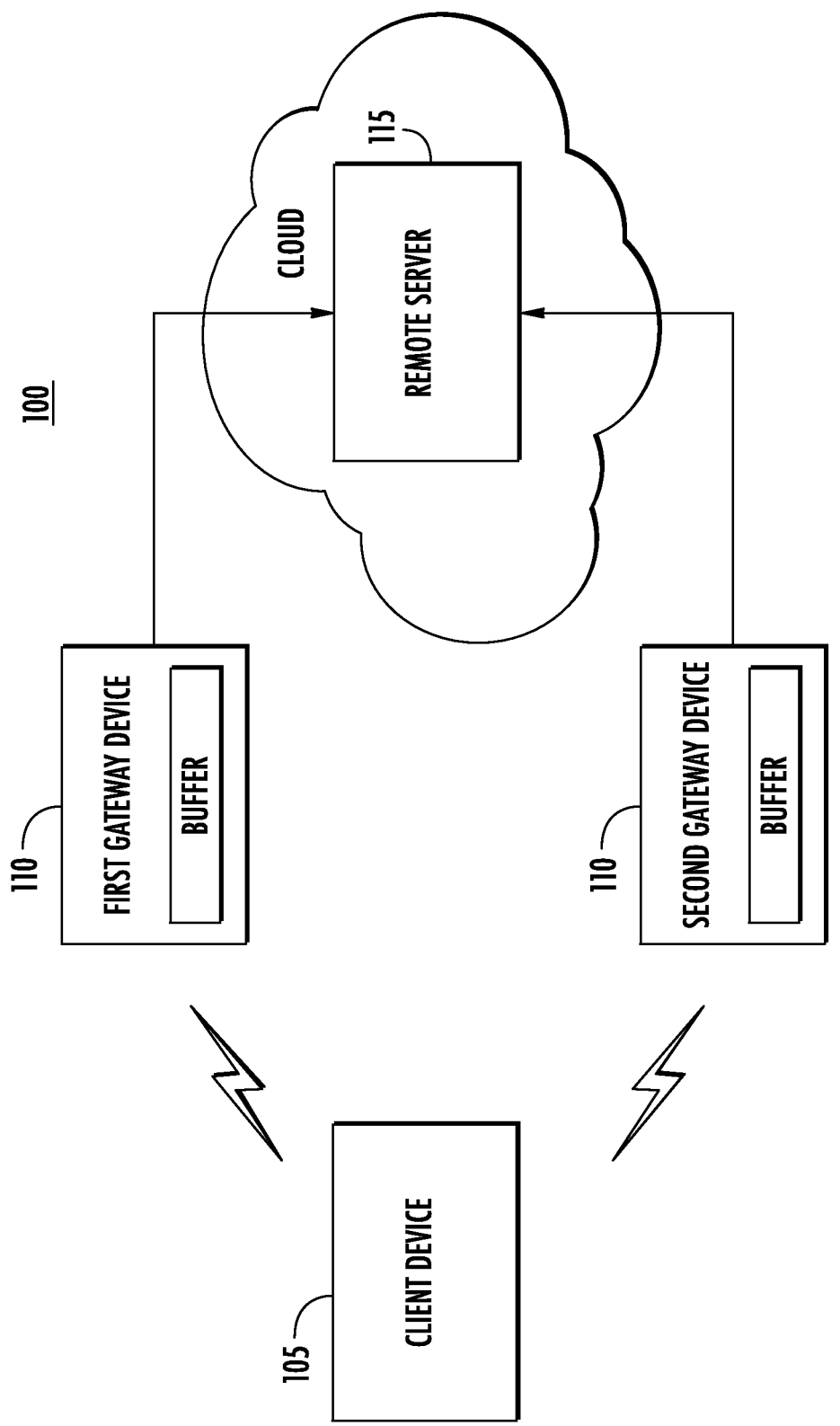
FIG. 1 is a block diagram of a system including a low power client device in wireless communication with two or more gateway devices which can communicate with a remote server that may be a cloud-based server in some embodiments according to the invention.

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

As described herein, embodiments according to the invention can provide systems and methods of operating that enhance the coverage of LPWANs and the battery life of client devices in large urban deployments. As appreciated by the present inventors, while signals from certain clients may attenuate significantly, they are still likely to be received by multiple gateways in a dense network. Gateway devices according to some embodiments can identify and transport weak received signals to the cloud (distributed computing). A joint decoding system can be deployed in the cloud that may coherently combine the weak signals that are received across multiple city gateways to decode the underlying data. As a result, embodiments can expand the decoding range of the LPWAN network and improve battery-life for nodes that are in range allowing client devices to spend less energy per transmitted bit. Embodiments can be implemented using the LoRaWAN platform to deploy coherent diversity combining that demonstrates increased network coverage and improved data rates across client devices.

As further appreciated by the present inventors, both the LPWAN gateways and clients are designed to be economical and deployed at scale, and without the time synchronization required for coherent combining and collating.

One challenge at the gateway is identifying packets that are significantly below the noise floor. In some embodiments, the approach to resolving this challenge is an implementation of a gateway device that leverages the structure of the LoRaWAN LPWAN protocol. Specifically, in some embodiments, a transform is used to convert received data symbols containing a priori unknown bits into a repeated and known sequence of signals, much like the preamble. Moreover, this approach can use both the preamble and a transformed data sequence to detect any packet by, in effect, lengthening the time interval over which the gateway can detect the packet.

For example, in some embodiments, LoRaWAN transmits data symbols as chirps where an initial frequency is a function of the data. For instance over a bandwidth of 100 Hz, LoRa could represent the bit "0" as a chirp starting at 2 Hz and bit "1" as a chirp starting at 52 Hz. A filter according to the present invention can aliases the received LoRa signal so that frequencies modulo 50 Hz fold into each other. This means that both bit "0" and bit "1" will map to an identical chirp starting at 2 Hz. This filter can be applied through the received packet to obtain a repeated sequence of chirps as long as the entire packet itself. This technique allows the detection of the packet with a much higher resistance to noise compared to using the preamble alone, without incurring additional overhead.

In still other embodiments, the preamble portion of a potential packet can be filtered with a known preamble that would be included in a chirp spread-spectrum modulated packet to identified as a packet that may be decoded by the remote server configured to decode the potential packet using similar data from another gateway device on the same potential packet. In some embodiments, the filtering may be performed by convolving the chirps of the known preamble with the chirps included in the preamble portion of the potential packet. Other types of filters may be used. In still other embodiments, the chirps of the sync portion of the potential packet can also be filtered with the chirps of the sync portion of the known packet to detect the potential packet. In still other embodiments, the above approach can be used in conjunction with the other methods and systems described herein.

At the cloud, the system presents a large number of receptions from various gateways in a city, pruning for weak signals and identifying common signals between gateways. Embodiments according to the present invention can utilize multiple optimizations for operations at city-scale. For instance, as appreciated by the present inventors, it is often the case that gateways transmit weak signals to the cloud for packets that have already been decoded at other gateways. However, realizing that the weak signal has already been decoded elsewhere may be difficult without decoding in the cloud in the first place.

Accordingly, prior to sending any signal data to the cloud, a gateway device according to the present invention can transmit the location, frequency, accurate timing and signal-to-noise ratio (SNR) of the received weak packet (sometimes referred to herein as "a potential packet") which may otherwise fail to decode properly at the gateway device. The cloud collates such information across multiple gateways and may request data only from the gateways that receive these signals at a certain level that enables those packets to be identified as potential packets that may warrant further analysis for recovery. In doing so, some embodiments save valuable uplink bandwidth at the gateways and computation at the cloud. Still further, embodiments according to the present invention can mitigate a range of other challenges at the cloud such as imperfect timing, frequency offsets and overlapping transmissions.

Experimental data was collected in conjunction with the operation of systems deployed in accordance with the present invention (the "system") in both indoor and outdoor environments using two testbeds on the Carnegie Mellon University campus and around the city of Pittsburgh. Eight user-deployed gateways built using custom hardware platform support a testbed covering a 0.6 sq.km. area around campus, which was used to study the performance with regard to local packet detection, range and data-rates. Four rooftop gateways supported the OpenChirp LPWAN network which serviced a large 10 sq.km. area that was used to acquire traces for large-scale simulations. These experiments provided the following results.

By coherently combining across 8 base stations, the deployed system improved the SNR of a typical LoRaWAN transmission by 3.16 dB, extending battery life by up to 4 times. The system improved the maximum communication range of 8 indoor user-deployed gateways in urban settings from 60 m in LoRaWAN to 200 meters, an overall increase in coverage area by 10 times. Our trace-driven simulation, based on city-wide drive tests, estimates an overall increase in coverage area by up to 2× provided by the system in comparison to LoRaWAN.

Accordingly, embodiments according to the present invention can provide a technique that leverages the geographical diversity of unplanned, user-deployed gateways to enable joint decoding of weak transmissions, which can improve battery-life for users in the network and increases the coverage area. Still further, embodiments according to the present invention can provide a hardware platform and the methods of operating to detect weak LoRaWAN transmissions (potential packets) locally at the gateway. In still further embodiments according to the present invention can provide, the system can provide an architecture that uses LoRaWAN to enable joint-decoding of signals in the cloud in a scalable manner.

In some embodiments according to the present invention, packets that are weakly received (potential packets) at a gateway device may not be decodable at the gateway alone, but by collating the same potential packet received across multiple gateway devices in the cloud, the potential packets may be successfully decoded. At one level, this enables an expansion of network coverage area reaching clients deep inside buildings, underground or in outer reaches of the city. More fundamentally, it may reduce energy consumption by many client devices, even if they are within range of some gateways by allowing the gateways to increase their respective data rate without experiencing any loss in performance.

FIG. 1 is a block diagram of a system 100 including a low power client device 105 in wireless communication with two or more gateway devices 110 which can communicate with a remote server 115 that may be a cloud-based server in some embodiments according to the invention. It will be understood that the gateway devices 110 can be user-deployed both indoors and outdoors, at relatively low cost. These devices 110 may have an Ethernet backhaul to the remote server 115 (i.e, cloud) that provides an uplink bandwidth of a few megabits per seconds. Much like the standard LoRaWAN architecture, MAC-layer scheduling can be performed at the cloud where the gateway devices 110 can transmit the data received by the gateway device 110 to the remote server 115. Although only a single client device 105 is shown, more may be present in the system 100.

It will be further understood that to accommodate the decoding of the received weak packets, the gateway devices 110 may transmit raw received I/Q signals (or samples) that comprise the weak packets to the remote server 115. The remote server 115 aggregates such weak signals and coherently combines them to decode the underlying data bits from weak packets received across multiple gateway devices 110. In other words, the remote server 115 can perform a joint optimization of the PHY-layer, improving battery life and the range of low-power clients 105 at the expense of increased computation at the remote server 115. Accordingly, it will be understood that the operations described above may be implemented using samples of the signals, such as I/Q samples, although other types of samples may be used in some embodiments.

As appreciated by the present inventors, the approach outlined herein presents challenges which can be addressed by embodiments according to the present invention. For example, given that weak signals from the clients 105 are often well below the noise floor, gateway devices may not successfully decode the packets in the weak signals. Unless address as described herein, the gateway devices will send all their received raw signal data to the remote server for detection and decoding of the weak signals that make up the potential packets, which may overload the limited uplink bandwidth provided to the gateway devices.

Further, when considered at the city-scale, overlapping weak transmissions from different clients may be received at the same time by different gateway devices 110, making data recovery more challenging at the remote server 115. Additionally, due to the use of low-cost hardware that lacks precise time synchronization, each of the gateway devices 110 may add clock and frequency errors to the captured signals. These errors should be resolved before the signals can be combined.

Accordingly, embodiments according to the invention can be directed to address the above challenges. Specifically, (1)

the gateway device 110 can identify and process weak transmissions (i.e., potential packets) which can be transmitted to the remote server 115 for processing and (2) a scalable cloud based PHY-layer processing system embodied by the remote server 115 supports processing of the weak signals (potential packets) at a city-scale.

Pursuant to above described embodiments, to reap the benefits of coherent diversity combining across multiple gateways device 110, the system detects weak signals well below the noise floor at a single LoRaWAN gateway device 110. Specifically, LoRa transmits signals in the form of chirps, i.e. signals whose frequencies increase linearly in time. In addition, several of these chirps are identical. For instance, consider the initial preamble in LoRaWAN with as many as 16 identical and consecutive chirps. Accordingly, a receiver can be provided that coherently sums time adjacent symbols or chirps included in the received signal over a sliding window. If the summing-up operation is truly coherent, the underlying signal (i.e. the chirps) will combine constructively, while noise will add up incoherently. This method can therefore provide a resulting signal with an amplitude that can be increased above a threshold to indicate that the signal may be associated with a potential packet due to the coherent structure of the signal. In other words, this approach can effectively increase the signal-to-noise ratio of the received signal significantly, allowing the detection of at least the preamble of a LoRaWAN packet. Moreover, the longer the preamble sequence is, the greater may be the extent of the noise that the system may tolerate while allowing the detection of potential packet.

As appreciated by the present inventors, transmitting longer preambles may increase the overhead of the communication system, and in the long term, impact battery life of the client devices 105. Accordingly, in some embodiments, the present system can detect weak signals by using the data symbols in the potential packet in combination with the preamble symbols even though the transmitted data sequence is unknown at the gateway device 110.

Embodiments according to the invention can use the structure of the data symbols in LoRaWAN to improve detection of the packet in the presence of noise. In particular, the data symbols in a LoRaWAN packet are also a sequence of time adjacent chirps. However, unlike the preamble, LoRaWAN data includes a sequence of chirps with different frequency-shifts based on the bits that are encoded by the chirp but these shifts are not completely random.

In particular, the chirps undergo a discrete number of shifts based on the number of bits per chirp. For a spreading factor of SF (i.e. a transmission data rate of SF bits per chirp), the frequency shift is one of $2^{SF}$ values. The system therefore implements a solution that coherently reinforces time adjacent chirps, modulo the minimum possible frequency shift between them. This ensures that regardless of their underlying data, adjacent chirps can be summed together to reinforce each other while any noise sums up destructively as before. Given that there are a significantly larger number of data symbols compared to preamble symbols in any packet or in a series of packets, this provides an additional mechanism to detect packets below the noise level.

Mathematically, let $y_1, y_2, \ldots, y_m$ denote the m received data symbols and $x_1, x_2, \ldots, x_m$ denote the transmitted data bits encoded as frequency shifts, each a number between 0 and $2^{SF-1}$ where SF is the spreading factor. Let $\delta f = \text{Bandwidth}/2^{SF}$ denote the minimum possible frequency separation between two encoded data chirps. Then the received signal at any time t of the $i^{th}$ symbol as:

$$y_i(t) = h e^{j2\pi(f(t) - x_i \delta f)t} + n_1$$

where f(t) denotes the time varying frequency of the chirp, j is the square root of −1, h represents the wireless channel and $n_i$ represents noise. When multiplied by $e^{-j2\pi f(t)t}$ and viewed in the Fourier domain, this results in a single tone at frequency $x_i \delta f$ subject to noise. The location of the tone is a function of the underlying data which produces different quantity for different data symbols.

As appreciated by the present inventors, if the above equation is sub-sampled at times t that are multiples of $1/\delta f$ (for example $t = k/\delta f$ for integer values of k):

$$y_i(t) = h e^{j2\pi(f(t) - x_i \delta f)\frac{k}{\delta f}} + n_1 = h e^{j2\pi f(t)t} + n_1$$

This time, when multiplied by $e^{j2\pi(f(t)t}$ and viewed in the Fourier domain, the results is a single tone at frequency 0 (subject to noise) regardless of the underlying data in each symbol. In other words, sub-sampling in the time domain aliases of all the data peaks in the frequency domain into one frequency component (in this case, DC), while noise is spread uniformly across all frequency components.

In some embodiments, the system can repeat the sub-sampling across multiple time steps separated $1/\delta f$ and average the results. The resulting average reinforces peaks corresponding to all the data symbols coherently in one Fourier frequency component, while noise adds up incoherently among all remaining bins. This approach can provide a LoRaWAN packet-detection mechanism that applies this operation across different sliding windows of the received signals.

Figure 4:
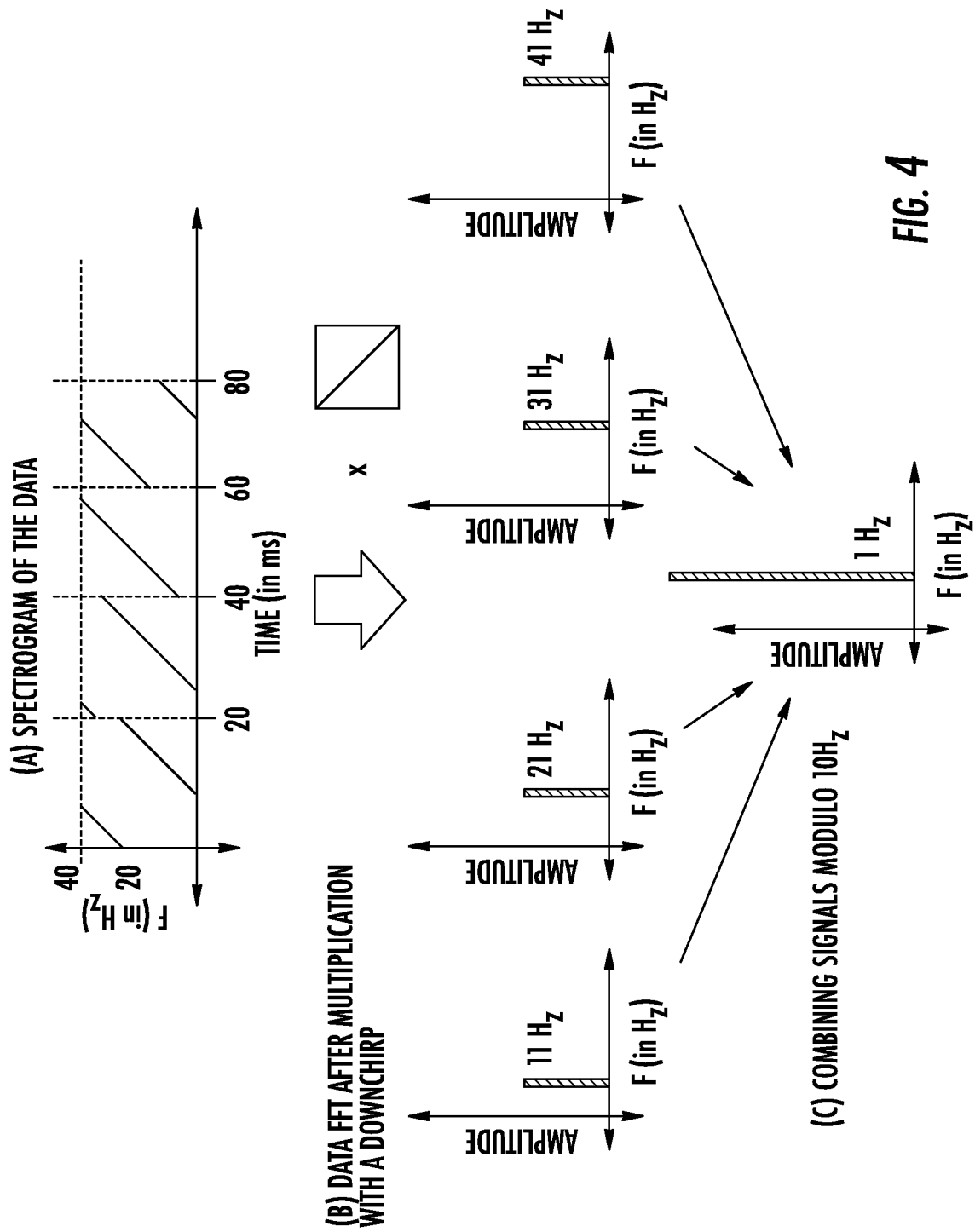
FIG. 4 is a graphical representation of the sub-sampling of time adjacent chirps included in a potential packet received at a gateway device to cause aliasing of different frequency components included in the chirps into a single frequency component in some embodiments according to the invention.

The result of this operation can indicate the detection of a potential packet based on the occurrence of a significant peak in the Fourier domain that dominates other peaks (subject to a threshold) as illustrated in FIG. 4. Given that this approach averages results over a large number of data symbols, it remains resilient to noise without making assumptions about the contents of the packet itself. In some embodiments the detection method can be provided by the following operations:

| | Algorithm 1: Charm's enhanced detection algorithm |
|---|---|
| 1 | for bits in instream do |
| 2 |   \| [C = I + jQ]=downsample(bits); |
| 3 |   \| for chirp_ length in C do |
| 4 |   \|  \| F = chirp_ length * down_ chirp; |
| 5 |   \|  \| F = Collect.collect(F);  // Data Collection |
| 6 |   \| end |
| 7 |   \| C = FCollect.modula($\delta f$);  // Modulus Bucketing |
| 8 |   \| if $\frac{\max(abs(fft(C)))}{\text{mean}(abs(fft(C)))} > \tau$ then |
| 9 |   \|  \| SEND C to CLOUD;  // Packet Forwarding |
| 10 |   \| end |
| 11 | end |

In some embodiments according to the invention, the present system can operate on the assumption that the received symbols are identical so that the adjacent symbols sum up coherently subject to noise and discrete shifts in frequency due to the data (as described above). In practice however, wireless signals from the LPWAN client to the gateway devices 110 can experience an additional arbitrary shift in frequency due to Carrier Frequency Offset (CFO).

CFO can be generated from the subtle variation in frequency between the clocks on the transmitter and receiver. Given that the client devices 105 are inexpensive, the clock can exhibit large and arbitrary frequency differences relative to the gateway. Additionally, the CFO for a given transmission received at different gateways is also different and must be resolved individually.

Two properties of CFO may impact on the operations described above. Particularly (1) CFO unlike data can introduce a frequency shift that is not discrete, but continuous. As a result, it is not simply eliminated by looking at the chirp in the Fourier domain "modulo δf" akin to the data as described above. (2) CFO can introduce a continuous phase shift $2\pi f \Delta_{CFO} t$ onto the received signal that accumulates over time. This means that even otherwise identical received symbols may add up incoherently owing to a time-varying phase shift. Embodiments according to the present invention can address this issue by realizing that it is sufficient to estimate $\Delta f_{CFO} t$ modulo δf to detect the LoRa packet.

In particular, the frequency offset over a packet $\Delta f_{CFO}$ can be decoupled into two components:

$$\left[\frac{\Delta f_{CFO}}{\delta f}\right]\delta f + \left\{\frac{\Delta f_{CFO}}{\delta f}\right\}\delta f,$$

an integer multiple of δf and the remaining fractional component respectively. Further, when examining the data chirps in the frequency domain modulo δf, all the data symbols appear identical given that all frequency shifts of the data are all multiples of δf. Similarly, the first term of the CFO:

$$\left[\frac{\Delta f_{CFO}}{\delta f}\right]\delta f$$

is also an integer multiple of δf and therefore disappears under the modulo. Only the fractional part of the CFO expression above persists and introduces a time varying phase shift of:

$$2\pi\left\{\frac{\Delta f_{CFO}}{\delta f}\right\}\delta f t$$

across symbols to eliminate the effect. In other words, embodiments according to the present invention can remains resistant to frequency offset, both in detecting the preamble as well as data symbols of a LoRaWAN packet.

Figure 2:
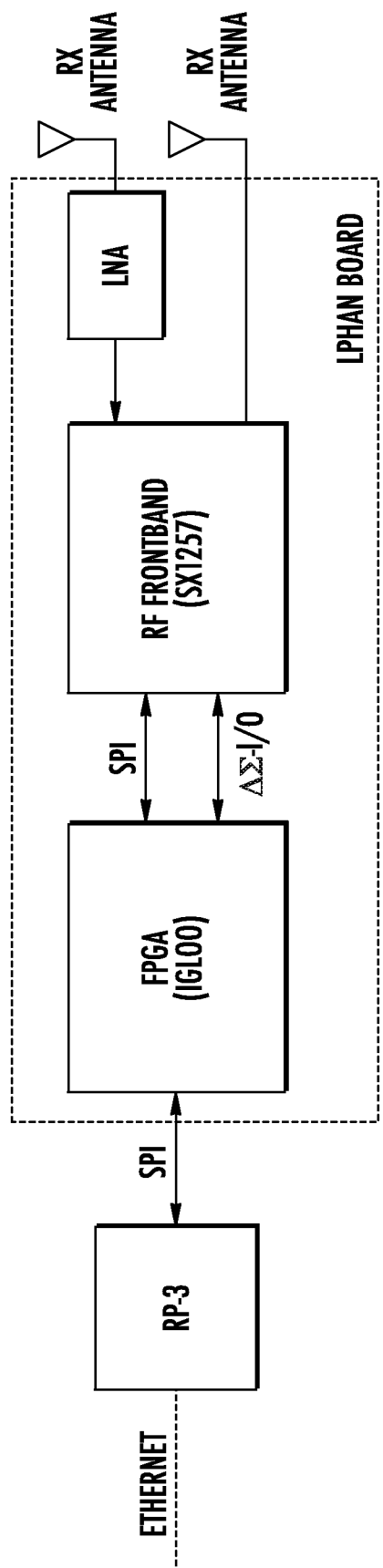
FIG. 2 is a block diagram of an auxiliary peripheral to a gateway device to provide the quadrature streams transmitted to the remote server in some embodiments according to the invention.

Embodiments according to the present invention can processes raw I/Q samples from the gateway devices 110, which can be selectively transmitted to the remote server 115 in real-time on request using the circuit and operations illustrated in FIG. 2 as an auxiliary peripheral to a gateway device 110 to provide the quadrature streams transmitted to the remote server 115.

In particular, some embodiments can utilize an SX1257 RF front-end that provides 1-bit delta-sigma modulated signals at a about 36 MSps each for the I and Q streams. In order to keep the data stream requirements more manageable lossless compression may also be used. In some embodiments, the IQ stream can be compressed by summing consecutive samples in windows of size 64 and convert it into a single 7-bit sample:

$$x_i = \sum_{j=64+i}^{64+i+63} s_j$$

where ($x_i$) is the analyzable samples, and ($s_j$) is the I/Q sample rates. A window size of 64 to enable a bandwidth of approximately 500 kHz that the RF front-end is capable of capturing. Upon applying the above technique, the compressed I/Q streams generate data at a rate of 9 Mbps, down from the original 72 Mbps.

In some embodiments, the delta-sigma I/Q samples were processed using a Microsemi IGLOO AGL250 FPGA, to provide the compression for data reduction. The stream of data was transferred using a high-speed serial interface (SPI) to a microprocessor (e.g., a Raspberry Pi), and forwarded when requested by the remote server 115 for additional processing. Each block of samples were double buffered to ensure the validity of the data during transfers. The microprocessor then performed additional local processing, time-stamping and temporary local storage until a stream is requested by the remote server 115. It will be understood that the FPGA can allow programmers to implement advanced real-time algorithms for packet decoding and/or full duplex transmission across multiple channels. In addition, the Raspberry Pi can enable ease of programmability when gathering low-rate statistics about the received signals at the gateway.

In some embodiments according to the invention, the remote server 115 seeks to coherently combine signals received from multiple gateway device 110 to recover and decode the weakly received signals identified as potential packets. At a high level, the remote server 115 can collates I/Q samples from multiple gateway devices and estimate the packet start time and wireless channel. It then uses standard coherent SIMO combining (described further in, for example Section 3. 1 of U.S. Provisional Application Ser. No. 62/761,784, entitled Exploiting Geographical Diversity Through Coherent Combining In Low-Power Wide-Area Networks filed in the U.S.P.T.O on Apr. 5, 2018) of the weak transmission received from the multiple gateway devices 110 to ensure that the data can be accurately recovered. This cloud-based PHY-layer approach can be repeated at city scale across clients and gateway devices 110.

Embodiments according to the present invention can use accurate timing of received weak signals at the gateways for two reasons: first, any offset in timing between signals corresponding to the same packet across gateways will prevent the signals from coherently combining. Second, the precise start time of packets across gateways is valuable information to identify the packet, allowing an inference as to which received signals across gateways correspond to the same packet.

Figure 3B:
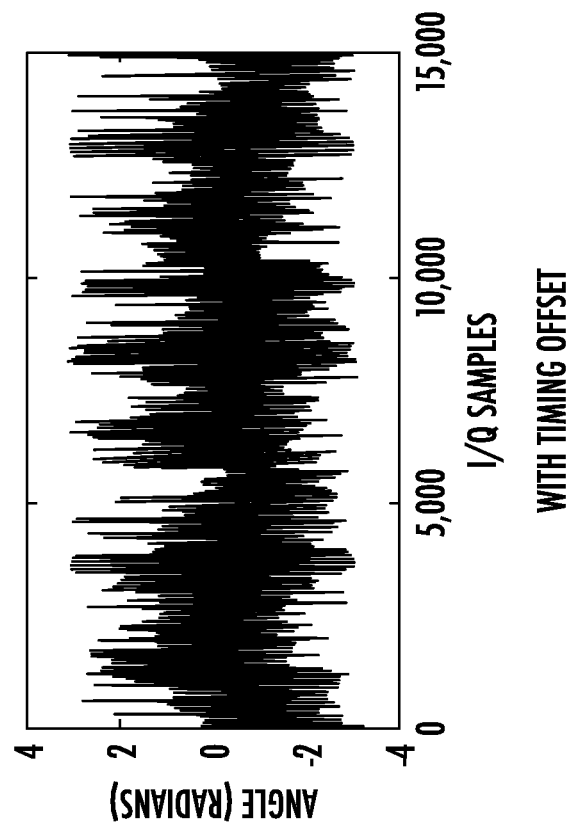
FIGS. 3a and 3b are graphs depicting examples of the phase difference between two gateway devices whose signals are offset by zero and one sample respectively in some embodiments according to the invention.
Figure 3A:
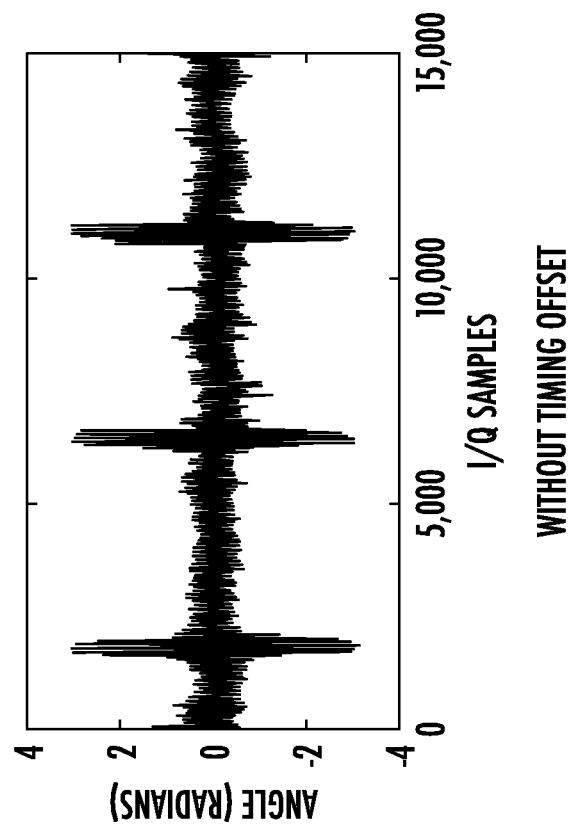

As appreciated by the present inventors, even a small offset in the timing between two gateway devices 110 can severely deteriorate coherent combining. FIGS. 3a and 3b depict a simple example of the phase difference between two gateway devices 110 whose signals are offset by zero and one sample respectively. Accordingly, an offset of one frequency bin can cause a significant time-varying error in phase between the gateway devices 110. As a result, summing up these signals would cause some symbols in-phase to reinforce, while others that are out-of-phase cancel each other.

Embodiments according to the present invention can address this challenge by recognizing that small time-errors between two gateway devices 110 can result in a phase difference over time that is predictable. As shown in FIGS. 3a and 3b this phase difference is a linear function of time, given by $2\pi f(t)\delta t$, where $f(t)$ is the instantaneous frequency of the chirp (linear in time) and $\delta t$, is the required timing offset. In principle, one can therefore estimate the slope in phase over time to recover the timing offset, which can be challenging, particularly when each received signal at each gateway device is completely buried below the noise. The phase of such signals at any such gateway device 110 may simply appear to be random.

Embodiments according to the present invention can address this challenge using two key properties: First, owing to coarse time synchronization of the gateways (via NTP), any residual timing error between them may be limited to a few samples. This allows an iterative optimization over a small number of time-shifts to infer the offset that leads to the best fit. Second, embodiments according to the present invention can extract timing offsets both from the preamble and the data symbols.

Specifically, embodiments according to the present invention may only consider the difference in phase between the same potential packet received at two different gateway devices 110. Given that, in the absence of timing offsets, both gateway devices 110 perceive the same underlying message bits over time, the resulting phase difference would be independent of the transmitted data bits whether they belong to the preamble or data.

Embodiments according to the present invention can therefore considers a range of possible small offsets between any two received signal sequences. For each candidate offset, the phase difference can be computes between the signals as a function of time. Then the true offset can be identified between the gateway devices 110 as the one whose phase difference varies minimally across the entire packet. Given that this approach averages measurements through the entire packet (both preamble and data), it can be highly resistant to noise.

Embodiments according to the present invention can also learn the time-offsets between gateway devices 110, particularly in busy urban deployments, by using information from past packets in that the coherence is only affected by timing errors between pairs of gateway devices 110, not the gateway device 110 and any particular client device 105. While these errors may change over time, over small intervals (e.g. hundreds of milliseconds), they are unlikely to change. As a result, one can use the measured time offset from a previous packet to infer the offset at the next packet that follows soon after. This can provide a history of the time-offsets, smoothed by algorithms such as Kalman filtering with outlier rejection, that can be used to predict time offsets between gateways even when signals from certain clients are too weak to measure these reliably.

In some embodiments according to the present invention, the remote server 115 determines which signals from the gate devices 110 correspond to the same packet from the same client so that those signals can be combined and the packet can be decoded. Moreover, this function is performed even in the presence of overlapping transmissions from multiple clients at geographically different locations.

Embodiments according to the present invention can address this challenge by using the timing information of packets to infer transmissions that correspond to the same user. It further uses the perceived signal-to-noise ratios and geographic location of the gateways and measures the likelihood that far-away gateways can listen to transmissions from the users at the observed signal-to-noise ratios. It then calculates a feature vector for each received signal that contains two tuple: (1) The time instance at which the packet was received; and (2) The geographic location of the gateway. An OPTICS clustering algorithm can be applied to then cluster received signals from multiple clients devices 105 at any time instance. Moreover, only signals with a sufficiently high signal-to-noise ratio are selected for combination. This is because transmissions that are highly noisy tend to add little additional value yet cost uplink bandwidth. A consequence of the clustering based on geographic location of the gateway is that it facilitates spatial re-use. Specifically, it is possible that weak transmissions from two different neighborhoods occur at the same time but are heard at distinct subsets of gateways.

In some embodiments, the remote server 115 can request the I/Q samples of signals buffered by the gateway devices 110 and the associated wireless channels, timing offsets, and frequency offsets for those signals using a message sent to the gateway devices 110. The I/Q samples sent by the gateway devices are processed to remove phase errors owing to time and frequency offsets in the received signals and are coherently sum up and multiply by the conjugate channels as described further in, for example Section 3 of U.S. Provisional Application Ser. No. 62/761,784, entitled Exploiting Geographical Diversity Through Coherent Combining In Low-Power Wide-Area Networks filed in the U.S.P.T.O on Apr. 5, 2018.

In some embodiments, the above-described operations can be carried out as follows:

---

Algorithm 2: Joint decoding algorithm 1  packets = receive_ data(candidates);
2  for p in packets do
3  | p = $e^{j2\pi(\Delta f)t}$p;            // Freq Offset Correction
4  | p = $e^{j2\pi f(\Delta t)}$p;           // Timing Offset Correction 5  | $h(p) = \dfrac{p}{\text{reference}}$;   // Channel Estimation 6  end
7  combined_ packet=zeros(p);
8  for p in packets do
9  | combined_ packet = combined_ packet = h*p;
10 end
11 decode(combined_packet);
12 SEND ACK;

---

In particular, in some embodiments the gateway devices transmit raw I/Q samples to the cloud, only when requested by the remote server 115. Each gateway device provides a circular buffer of I/Q streams as well as any recent snapshots containing a potential packet. For each potential reception, a gateway device reports its signature (center frequency and spreading factor), the time of the reception packet, the perceived wireless channel and signal-to-noise ratio to the remote server 115. The remote server 115 then performs clustering as described above and requests the raw I/Q samples only from gateway devices whose signals were chosen to be combined. Given that latency to a cloud-based server (i.e., the remote server 115) can be a few milliseconds (which can be smaller than a typical LoRaWAN packet size) embodiments according to the present invention can perform decoding virtually in real-time at LPWAN timescales, despite incurring multiple round-trip times in fetching information.

As appreciated by the present inventors, sometimes the clustering algorithm may fail as a result of too few signals to successfully combine and decode a packet using the gateway devices 110 that detected the packet alone. However, in some embodiments information can be fetched from other gateway devices 110 in the same geographical region as the cluster and tuned to the same frequency and may have received the same signal, yet at a signal-to-noise ratio too weak to detect locally. Therefore, all gateway devices 110 can store past signals for up to 1.6 seconds (maximum LoRaWAN packet length) in the circular buffer. This allows the remote server 115 to request signals from gateway devices 110, even in scenarios where only one gateway device in the entire network was able to locally detect a signal from a given transmitting client.

Figure 5:
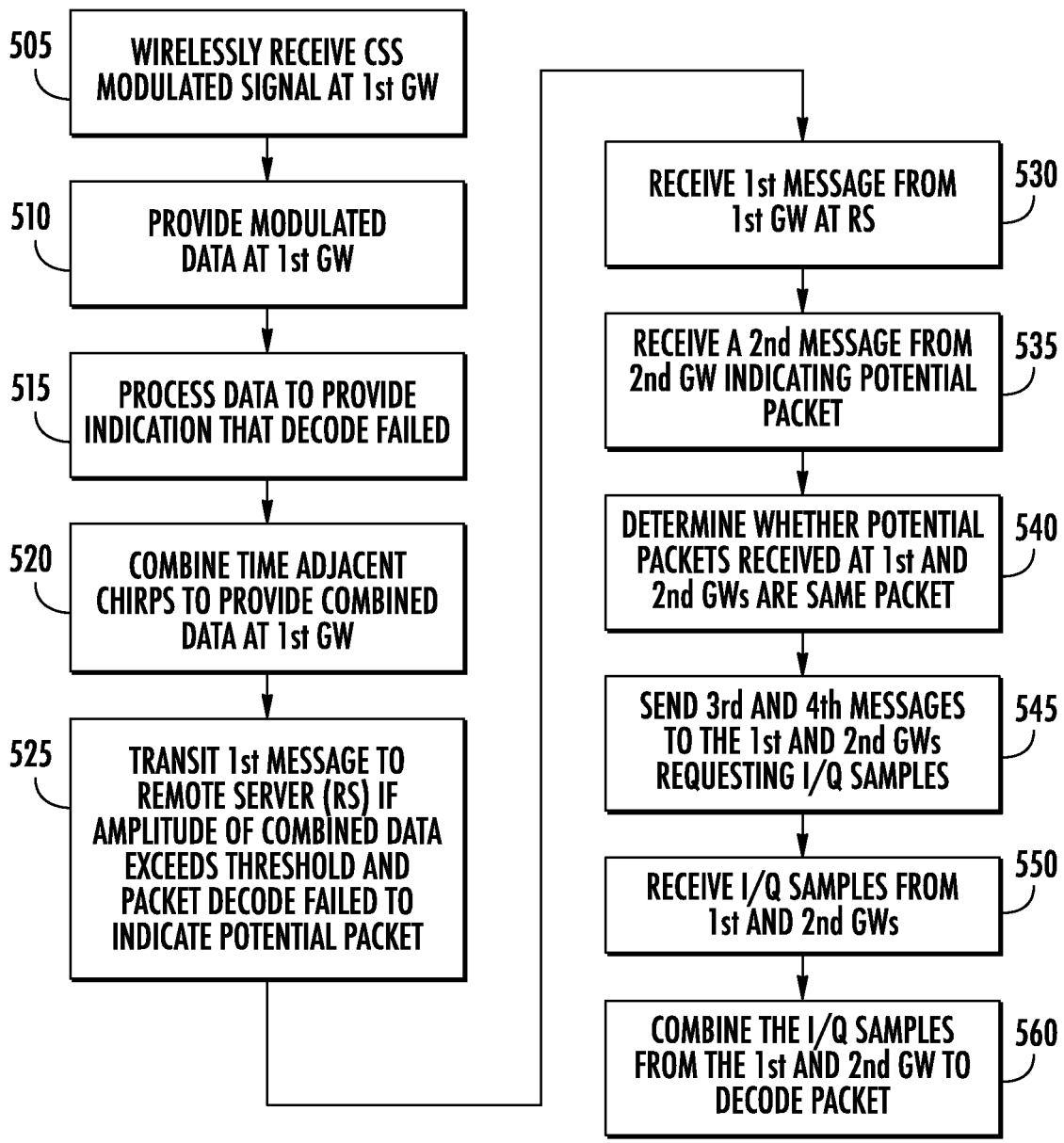
FIG. 5 is a flowchart illustrating methods of operating the wireless chirp spread-spectrum modulated network in some embodiments according to the invention.

FIG. 5 is a flowchart illustrating methods of operating the wireless chirp spread-spectrum modulated network in some embodiments according to the invention. Referring to FIG. 5 and FIG. 1, the system 100 can begin operations when a client device 105 transmits a packet within the wireless that is weakly received at the first gateway device 110 and the second gateway device 110 (block 505). It will be understood that the system 100 is a wireless network that provides packetized communications in a modulated chirp spread spectrum format. Accordingly, packets are transmitted using chirps to encode data for both a preamble interval of the packet as well as the data interval as described herein. The transmitted packet is demodulated at both the first gateway device 110 and at the second gateway device 110 (block 510). Because the packet is so weakly received the normal packet decoding process provided by the first gateway device 110 and the second gateway device 110 may both fail (block 515). The demodulated data at each of the gateways 110 is represented as a series of time adjacent chirps (as shown for example in FIG. 4) which can be sub-sampled to alias the different frequency components into a single frequency component, which can be summed together to provide an indication of whether the signals resulting in the failed decode may actually be a weakly received packet (i.e. a potential packet) (block 520).

If the amplitude of the summed components of the single frequency exceeds a threshold which indicates that signals may actually be a potential packet, each gateway device transmits a message to the remote server 115 including the time at which the potential packet was received and the channel frequency on which the potential packet was detected (block 525). It will be understood that although blocks 505 through 525 in FIG. 5 refer to a single message that is received by the first gateway 110, these same processes are carried out independently at the second gateway 110 to create the detection of a second potential packet as well as the transmission of a second message to the remote server 115 after the same determinations made by the second gateway device 110 outlined in blocks 505 through 525. In some embodiments, the coding rate of the potential packet may also be transmitted to the remote server 115.

Still referring to FIGS. 5 and 1, the first and second messages transmitted by the 1st and 2nd gateway devices 110, respectively are received at the remote server 115 (block 530 and block 535). Remote server 115 determines whether the potential packets identified in the 1st and 2nd messages from the first and second gateway devices 110 maybe the same packet (block 540). The remote server 115 can utilize the information provided in each of the messages such as the channel frequency and the times at which both of the potential packets were independently detected by gateway devices 110 to determine whether the potential packets may actually be a single packet which may be decoded when combined.

In response, the remote server 115 transmits a third message to the first gateway device 110 and fourth message to the second gateway device 110 each of which requests I/Q samples stored in the respective buffers provided in each of the gateway devices (block 545). The first gateway device one ten response to the third message by transmitting the requested samples to the remote server 115. Similarly, the second gateway device 110 responds to the fourth message by transmitting the requested samples to the remote server 115. The remote server 115 receives the samples from both the gateway devices in combines the samples in order to decode the packet as described herein.

As described herein, embodiments according to the invention can provide systems and methods of operating that enhance the coverage of LPWANs and the battery life of client devices in large urban deployments. As appreciated by the present inventors, while signals from certain clients may attenuate significantly, they are still likely to be received by multiple gateways in a dense network. Gateway devices according to some embodiments can identify and transport weak received signals to the cloud (distributed computing). A joint decoding system can be deployed in the cloud that may coherently combine the weak signals that are received across multiple city gateways to decode the underlying data. As a result, embodiments can expand the decoding range of the LPWAN network and improve battery-life for nodes that are in range allowing client devices to spend less energy per transmitted bit. Embodiments can be implemented using the LoRaWAN platform to deploy coherent diversity combining that demonstrates increased network coverage and improved data rates across client devices.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items.

The terminology used herein is for the purpose of describing particular embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

As will be appreciated by one of skill in the art, various embodiments described herein may be embodied as a method, data processing system, and/or computer program product. Furthermore, embodiments may take the form of a computer program product on a tangible computer readable storage medium having computer program code embodied in the medium that can be executed by a computer.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wired, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages, such as a programming language for a FPGA, Verilog, System Verilog, Hardware Description language (HDL), and VHDL. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computer environment or offered as a service such as a Software as a Service (SaaS).

Some embodiments are described herein with reference to flowchart illustrations and/or block diagrams of methods, systems and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

What is claimed:

1. A method of providing wireless communications comprising:
    wirelessly receiving a chirp spread-spectrum modulated signal at a first gateway device, the chirp spread-spectrum modulated signal being transmitted by a remote client device;
    demodulating the chirp spread-spectrum modulated signal at the first gateway device to provide demodulated data at the first gateway device;
    processing the demodulated data to provide an indication that a decode of a packet including the demodulated data failed; and
    combining time adjacent chirps included in the demodulated data from a time interval that is greater than a chirp spread-spectrum preamble time interval to provide combined data at the first gateway device.

2. The method of claim 1 wherein the combining time adjacent chirps comprises combining the time adjacent chirps included in the chirp spread-spectrum preamble and time adjacent chirps included in demodulated data outside the chirp spread-spectrum preamble to provide the combined data at the first gateway device.

3. The method of claim 1 wherein the combining time adjacent chirps comprises combining the time adjacent chirps only included in demodulated data outside the chirp spread-spectrum preamble to provide the combined data at the first gateway device.

4. The method of claim 2 wherein combining the time adjacent chirps comprises coherently combining the time adjacent chirps included in the chirp spread-spectrum preamble and the time adjacent chirps included in the demodulated data outside the chirp spread-spectrum preamble.

5. The method of claim 4 wherein coherently combining the time adjacent chirps comprises coherently combining the time adjacent chirps modulo a minimum possible frequency shifts between the time adjacent chirps.

6. The method of claim 5 wherein the minimum possible frequency shifts between the time adjacent chirps comprises $2^{SF-1}$ frequency shifts where SF is a spreading factor.

7. The method of claim 6 wherein a received signal is expressed as:

$$y_i(t) = he^{j2\pi(f(t)-x_i\delta f)t} + n_1,$$

where $\delta f$ is the minimum possible frequency shifts between the time adjacent chirps and f(t) denotes a time varying frequency of the time adjacent chirps, j is a square root of −1, and h denotes a wireless channel via which the received signal is received, and n denotes noise.

8. The method of claim 7 further comprising:
sub-sampling the received signal at times t being multiples of $1/\delta f$ to provide a sub-sampled signal; and
multiplying the sub-sampled signal by $e^{-j2\pi f(t)t}$ to alias separate data peaks in the received signal into one frequency bin to provide the combined data at the first gateway device.

9. The method of claim 1 further comprising:
transmitting a message from the first gateway device to a remote server responsive to an amplitude of the combined data exceeding a threshold value and the indication that the decode of the packet including the demodulated data failed.

10. A method of providing wireless communications in a wireless network, the method comprising:
wirelessly receiving a chirp spread-spectrum modulated signal at a first gateway device, the chirp spread-spectrum modulated signal being transmitted by a remote client device;
demodulating the chirp spread-spectrum modulated signal at the first gateway device to provide demodulated data at the first gateway device;
processing the demodulated data to provide an indication that a decode of a packet including the demodulated data failed;
filtering time adjacent chirps included in the demodulated data with time adjacent chirps of a known preamble included in a chirp spread-spectrum modulated signal to provide filtered data at the first gateway device; and
transmitting a message from the first gateway device to a remote server responsive to an amplitude of the filtered data exceeding a threshold value and the indication that the decode of the packet including the demodulated data failed.

\* \* \* \* \*

UNITED STATES PATENT AND TRADEMARK OFFICE
CERTIFICATE OF CORRECTION

PATENT NO. : 10,833,725 B2
APPLICATION NO. : 16/890102
DATED : November 10, 2020
INVENTOR(S) : Dongare et al.

Page 1 of 1

It is certified that error appears in the above-identified patent and that said Letters Patent is hereby corrected as shown below:

In the Specification

Column 8, Line 17:
Delete "$e^{j2\pi(f(t)t}$" and insert -- $e^{-j2\pi f(t)t}$ --

Signed and Sealed this
Twelfth Day of January, 2021

Andrei Iancu
*Director of the United States Patent and Trademark Office*